(12) United States Patent
Kanarek (10) Patent No.: US 11,735,841 B1
(45) Date of Patent: Aug. 22, 2023

(54) MOUNT PLATE FOR AUDIOVISUAL DEVICES

(71) Applicant: Ross Kanarek, Plainview, NY (US)

(72) Inventor: Ross Kanarek, Plainview, NY (US)

( * ) Notice: Subject to any disclaimer, the term of this patent is extended or adjusted under 35 U.S.C. 154(b) by 0 days.

(21) Appl. No.: 17/902,347

(22) Filed: Sep. 2, 2022

(51) Int. Cl.
| H01R 11/20 | (2006.01) |
| H05K 5/02 | (2006.01) |
| H01M 50/247 | (2021.01) |
| H01M 50/244 | (2021.01) |
| H01M 50/298 | (2021.01) |
| H01M 50/296 | (2021.01) |
| H01R 4/2433 | (2018.01) |
| H01R 33/72 | (2006.01) |

(52) U.S. Cl.
CPC .......... H01R 11/20 (2013.01); H01M 50/244 (2021.01); H01M 50/247 (2021.01); H01M 50/296 (2021.01); H01M 50/298 (2021.01); H05K 5/0247 (2013.01); H01M 2220/30 (2013.01); H01R 4/2433 (2013.01); H01R 33/72 (2013.01)

(58) Field of Classification Search
CPC ...... H01R 11/20; H01R 33/72; H01R 4/2433; H01R 11/11; H01R 11/22; H01R 11/24; H01M 50/244; H01M 50/247; H01M 50/296; H01M 50/298; H01M 2220/30; H05K 5/0247

See application file for complete search history.

(56) References Cited

U.S. PATENT DOCUMENTS

| 7,880,431 | B2 | 2/2011 | Rayl |
| 9,781,496 | B2 | 10/2017 | Conrad |
| 10,197,630 | B2* | 2/2019 | Kanarek ........... H01M 10/4257 |
| 10,630,095 | B1* | 4/2020 | Kanarek ............... H02J 7/0063 |
| 10,841,492 | B2* | 11/2020 | Kanarek ............. G06F 13/4282 |
| 2005/0225959 | A1 | 10/2005 | Pohlert |
| 2008/0180549 | A1 | 7/2008 | Lee |
| 2010/0254696 | A1 | 10/2010 | McKay |
| 2012/0306450 | A1 | 12/2012 | Nakayama |
| 2013/0002175 | A1 | 1/2013 | Shimizu |
| 2013/0057076 | A1 | 3/2013 | Lavender |
| 2013/0320926 | A1 | 12/2013 | Kerfoot, Jr. |
| 2014/0361740 | A1 | 12/2014 | Suzuki |
| 2015/0035473 | A1 | 2/2015 | Zhou |

(Continued)

*Primary Examiner* — Travis S Chambers
(74) *Attorney, Agent, or Firm* — Shore IP Group, PLLC; Sean R. Wilsusen, Esq.

(57) ABSTRACT

A mount plate includes a mount plate housing for coupling an audiovisual device with a battery. A power terminal in the mount plate housing provides electrical power to the audiovisual device. A hot wire connected with the power terminal extends from the mount plate housing. The hot wire is configured to connect with a corresponding hot wire of the audiovisual device. A ground wire extending from the mount plate housing is configured to be connected with a corresponding ground wire of the audiovisual device. A first insulation piercing interconnect is connected with the hot wire. The first insulation piercing interconnect is configured to connect the hot wire with the corresponding hot wire of the audiovisual device. A second insulation piercing interconnect is connected with the ground wire. The second insulation piercing interconnect is configured to connect the ground wire with the corresponding ground wire of the audiovisual device.

18 Claims, 10 Drawing Sheets

(56) References Cited

U.S. PATENT DOCUMENTS

| | | |
|---|---|---|
| 2015/0061603 A1 | 3/2015 | Loftus |
| 2015/0318581 A1 | 11/2015 | Johnson |
| 2016/0006280 A1 | 1/2016 | Ikeda |
| 2016/0126758 A1 | 5/2016 | Wu |
| 2016/0254684 A1 | 9/2016 | Gothoskar |
| 2016/0299194 A1 | 10/2016 | Kanarek |
| 2016/0311094 A1 | 10/2016 | Mergener |
| 2017/0013369 A1 | 1/2017 | Renken |
| 2017/0077722 A1 | 3/2017 | Jung |

\* cited by examiner

MOUNT PLATE FOR AUDIOVISUAL DEVICES

FIELD

The present disclosure relates to a mount plate and, more particularly, to a mount plate for audiovisual equipment.

BACKGROUND

In many items of audiovisual recording equipment, a rechargeable battery attaches to a battery mount plate which is attached to the audiovisual recording equipment. The mount plate can incorporate power terminals that receive power from the battery and data terminals for communication between the battery and the audiovisual recording equipment. Such battery mount plates can be attached semi-permanently to the audiovisual equipment and provide an industry-standard mounting surface which a rechargeable battery may be quickly and easily attached to or detached from. Examples of industry-standard mounting surfaces include 3-stud mounts, B-mounts and V-mounts.

As current/power demands for audiovisual equipment have increased, manufacturers have generally opted for factory-installed direct wired or soldered connections between mount plates and audiovisual equipment. This poses a challenge in changing or replacing the battery mount plate due to the factory-installed connection between the battery mount plate and the audiovisual recording equipment.

SUMMARY

A mount plate according to aspects of the present disclosure utilizes existing mounting surfaces on an audiovisual device and an insulation piercing interconnect to electrically connect a new battery mount plate to the wiring of an audiovisual device. A user can exchange the battery mount interface by removing the screws which attach the battery mount plate to the audiovisual device and cutting the directly wired connection. The user can then insert the cut wires from the audiovisual device into the insulation piercing interconnect extending from the battery mount plate and reattaching the mount plate with the screws (e.g., whether provided or from the older mount plate). This allows a person of minimal technical skill and without specialized tools, to exchange a battery mount plate for a new battery mount plate quickly and effectively.

Provided in accordance with aspects of the present disclosure is a mount plate including a mount plate housing configured to be coupled with an audiovisual device and a battery. A power terminal in the mount plate housing provides electrical power to the audiovisual device. A hot wire connected with the power terminal extends from the mount plate housing. The hot wire is configured to connect with a corresponding hot wire of the audiovisual device. A ground wire extends from the mount plate housing. The ground wire is configured to connect with a corresponding ground wire of the audiovisual device. A first insulation piercing interconnect is connected with the hot wire. The first insulation piercing interconnect is configured to connect the hot wire with the corresponding hot wire of the audiovisual device. A second insulation piercing interconnect is connected with the ground wire. The second insulation piercing interconnect is configured to connect the ground wire with the corresponding ground wire of the audiovisual device.

In an aspect of the present disclosure, the first insulation piercing interconnect and the second insulation piercing interconnect create a solder-free connection between the hot wire and the corresponding hot wire of the audiovisual device and/or between the ground wire and the corresponding ground wire of the audiovisual device.

In an aspect of the present disclosure, the audiovisual device is a light, a camera, or a monitor.

In an aspect of the present disclosure, the mount plate housing includes a V-mount, a B-mount or a 3-stud mount battery connection.

In an aspect of the present disclosure, the first insulation piercing interconnect forms a semi-permanent connection between the hot wire and the corresponding hot wire of the audiovisual device. The second insulation piercing interconnect forms a semi-permanent connection between the ground wire and the corresponding ground wire of the audiovisual device.

In an aspect of the present disclosure, the first insulation piercing interconnect and/or the second insulation piercing interconnect include(s) a first arm and a second arm pivotably coupled with the first arm. A protrusion extends from the first arm or the second arm. An orifice is defined in the other of the first arm or the second arm. The orifice is configured to receive the protrusion extending from the first arm or the second arm.

In an aspect of the present disclosure, the first insulation piercing interconnect and/or the second insulation piercing interconnect includes a first arm defining a first surface and a second arm defining a second surface configured to face the first surface of the first arm. The second arm is pivotably coupled with the first arm. A conductive member extends from the first surface of the first arm and/or the second surface of the second arm. The conductive member is configured to pierce an insulative layer of the corresponding hot wire of the audiovisual device or an insulative layer of the corresponding ground wire of the audiovisual device.

In an aspect of the present disclosure, the conductive member includes a first projection defining a first sharp edge and a second projection defining a second sharp edge. A channel is defined between first projection and the second projection.

In an aspect of the present disclosure, the first sharp edge is angled toward the channel, and the second sharp edge is angled toward the channel.

In an aspect of the present disclosure, a cable lock extends from the first arm or the second arm. The cable lock is configured to prevent longitudinal translation of the corresponding hot wire of the audiovisual device or the corresponding ground wire of the audiovisual device.

In an aspect of the present disclosure, the mount plate housing includes a first battery power terminal, a second battery power terminal, and a battery ground terminal. The first battery power terminal and the second battery power terminal are configured to conduct different voltages from the battery.

In an aspect of the present disclosure, a switching circuit selectively activates the first battery power terminal or the second battery power terminal. The switching circuit may include a resistor or a magnet.

In an aspect of the present disclosure, the mount plate housing connects with the battery by an electro-mechanical connection.

In an aspect of the present disclosure, the mount plate includes at least one auxiliary port.

In an aspect of the present disclosure, the mount plate is configured to receive a dual-voltage battery.

In an aspect of the present disclosure, the mount plate includes a low voltage pin configured to conduct low voltage current to the audiovisual device. The mount plate also includes a high voltage pin configured to conduct high voltage current to the audiovisual device.

In an aspect of the present disclosure, the low voltage pin is configured to conduct a current from about 11 volts to about 17 volts to the audiovisual device. The high voltage pin is configured to conduct current from about 17.1 volts to about 34 volts to the audiovisual device.

BRIEF DESCRIPTION OF THE DRAWINGS

Various aspects and features of the present disclosure are described hereinbelow with reference to the drawings wherein.

DETAILED DESCRIPTION

Descriptions of technical features or aspects of an exemplary configuration of the disclosure should typically be considered as available and applicable to other similar features or aspects in another exemplary configuration of the disclosure. Accordingly, technical features described herein according to one exemplary configuration of the disclosure may be applicable to other exemplary configurations of the disclosure, and thus duplicative descriptions may be omitted herein.

Exemplary configurations of the disclosure will be described more fully below (e.g., with reference to the accompanying drawings). Like reference numerals may refer to like elements throughout the specification and drawings.

The phrases "mount plate," and "battery mount plate" may be used interchangeably herein. The phrases "battery," "battery pack," and "pack" may be used interchangeably herein.

While many audiovisual devices come equipped with an existing mount plate, power standards change over time and mount plates may need replacement. Therefore, there is often a need to replace or upgrade the mount plates of audiovisual equipment. However, the wired connection between audiovisual devices and pre-installed or existing mount plates is often a hard wired or soldered connection that requires specialized equipment and training to rewire. A mount plate described according to aspects of the present disclosure allows a user to replace or upgrade a mount plate with minimal equipment and minimal training.

Figure 4:
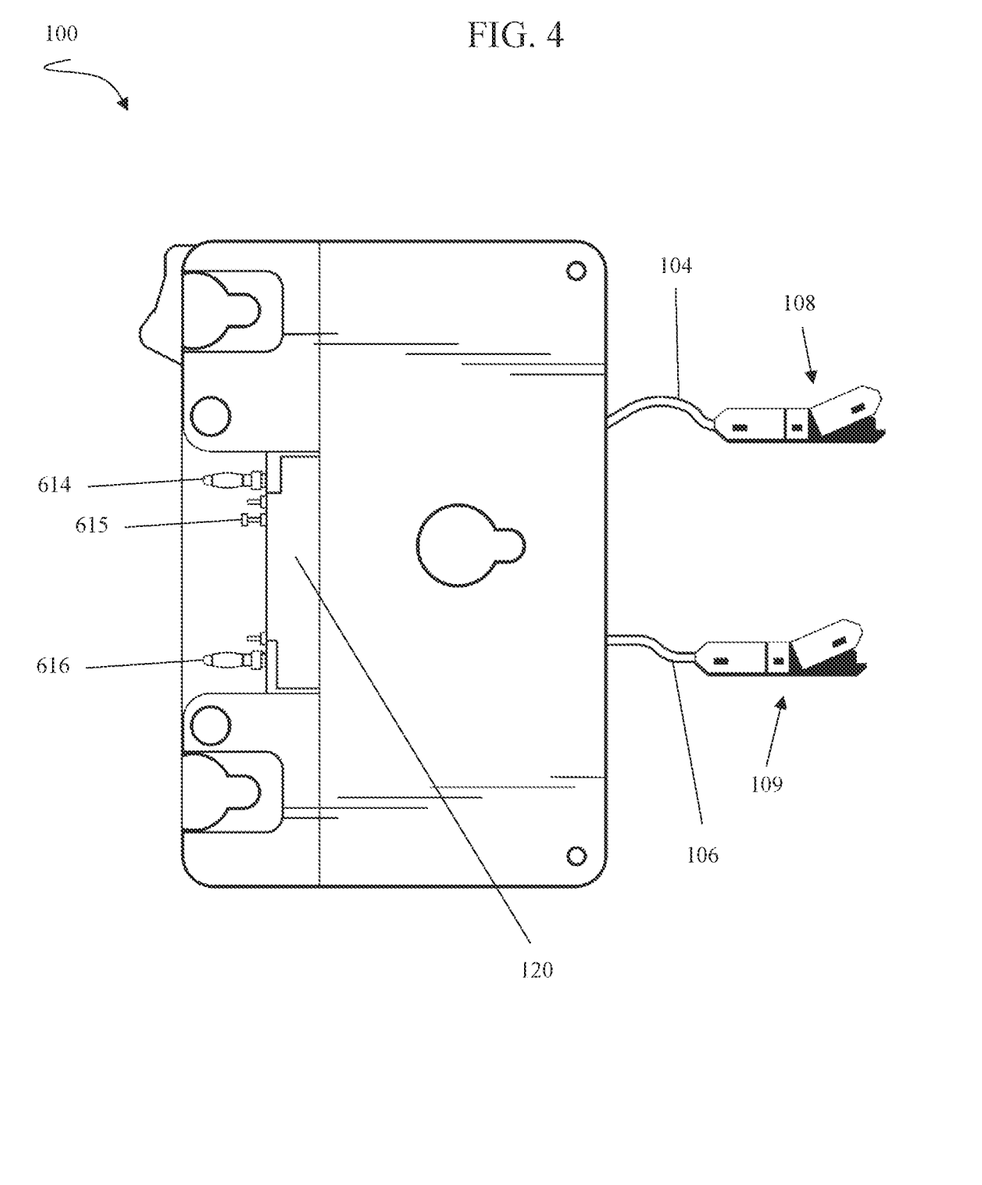
FIG. 4 illustrates the opposite side of the mount plate with respect to FIG. 3.

Referring to FIGS. 1-5, a mount plate 100 including a mount plate housing 101 is configured to be coupled with audiovisual device 102 and a battery (e.g., the battery physically mounts to the mount plate housing 101 and electrically connects with battery mount block 120 shown in FIG. 4). The mount plate 100 provides a physical/mechanical and electrical/data transfer interface between the battery and the audiovisual device 102 (e.g., a light, a camera, or a monitor). For example, the mount plate 100 facilitates a transfer of power from the battery to the audiovisual device 102 while also physically connecting the battery to the mount plate 100. Audiovisual devices that employ a mount plate may include, without limitation, cameras, lighting, monitors, audio recorders, video recorders, wireless transmitters (e.g., for audio and/or video), focus/iris/zoom controllers and any other production (e.g., film production) accessories, which connect to the camera, lighting, or monitor.

A power terminal 103 in the mount plate housing 101 provides electrical power to the audiovisual device 102 from the battery connected with the mount plate 100. An opposite side of the power terminal 103 is configured to connect with the battery (e.g., through battery mount block 120 shown in FIG. 4). A hot wire 104 connected with the power terminal 103 extends from the mount plate housing 101. The hot wire 104 is configured to connect with a corresponding hot wire 105 of the audiovisual device 102. A ground wire 106 also extends from the mount plate housing 101. The ground wire 106 is configured to connect with a corresponding ground wire 107 of the audiovisual device 102.

Figure 1:
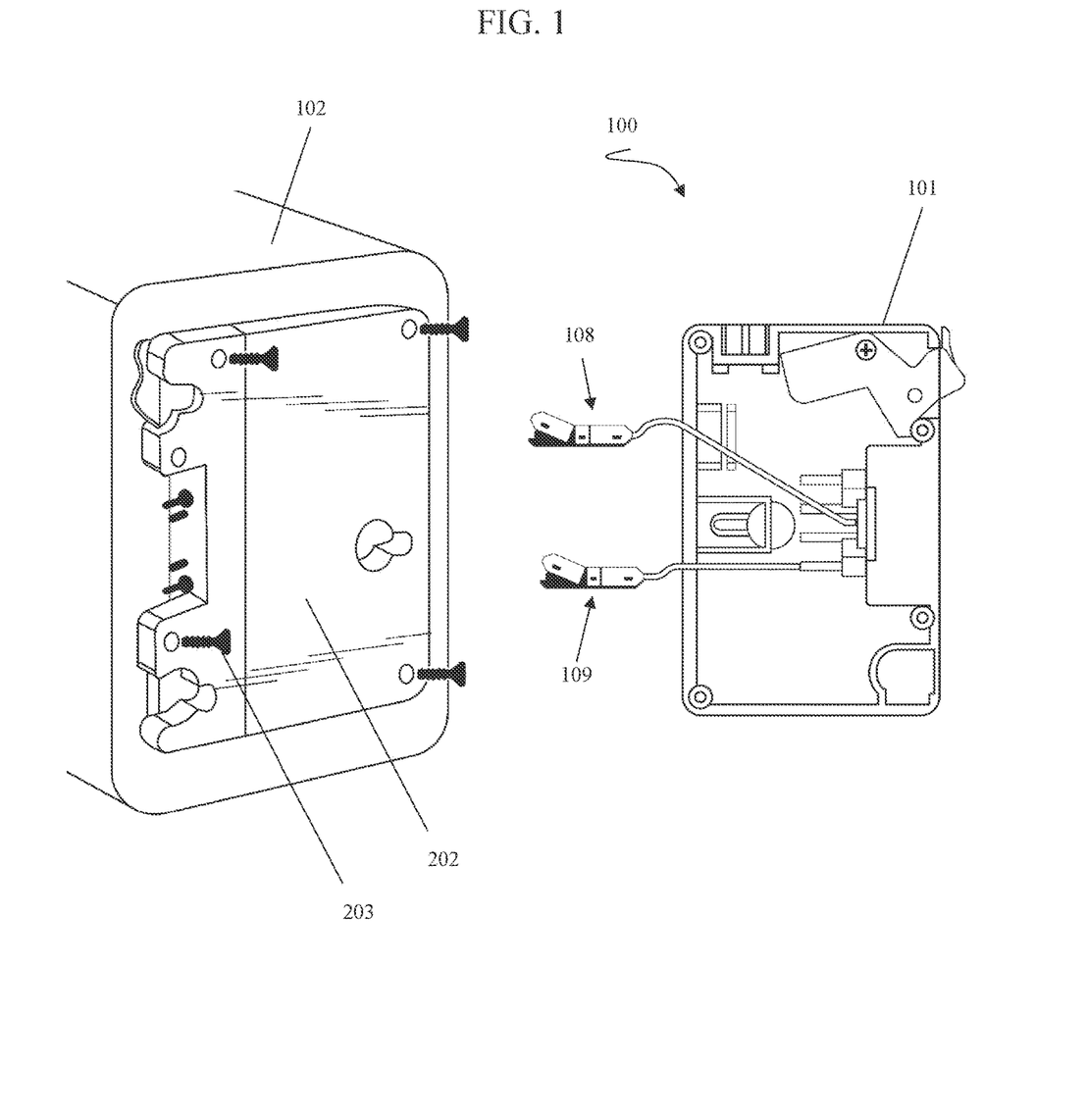
FIG. 1 is a perspective view of a mount plate configured to replace an existing mount plate of an audiovisual device according to aspects of the present disclosure.
Figure 2:
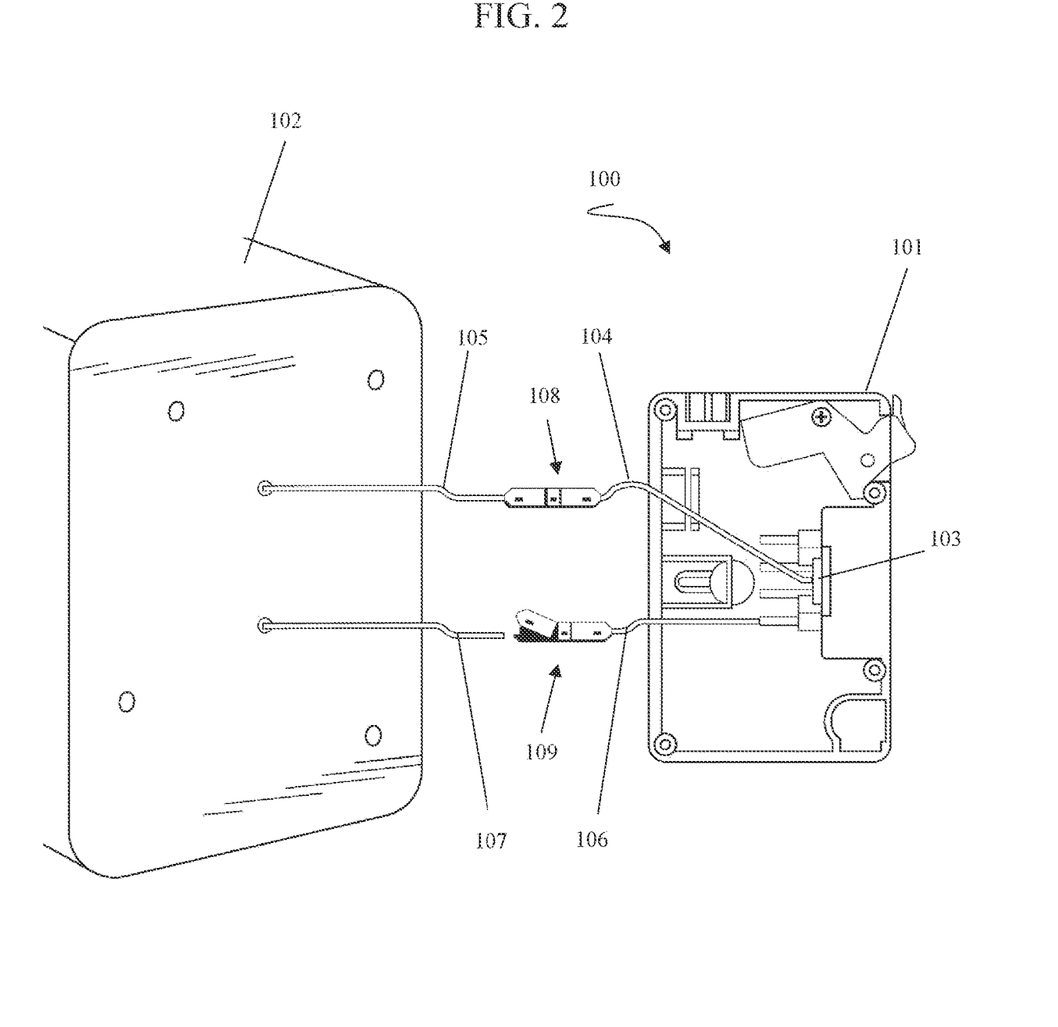
FIG. 2 is a perspective view of the mount plate of FIG. 1 with the existing mount plate removed and the mount plate electrically connected with the audiovisual device.
Figure 3:
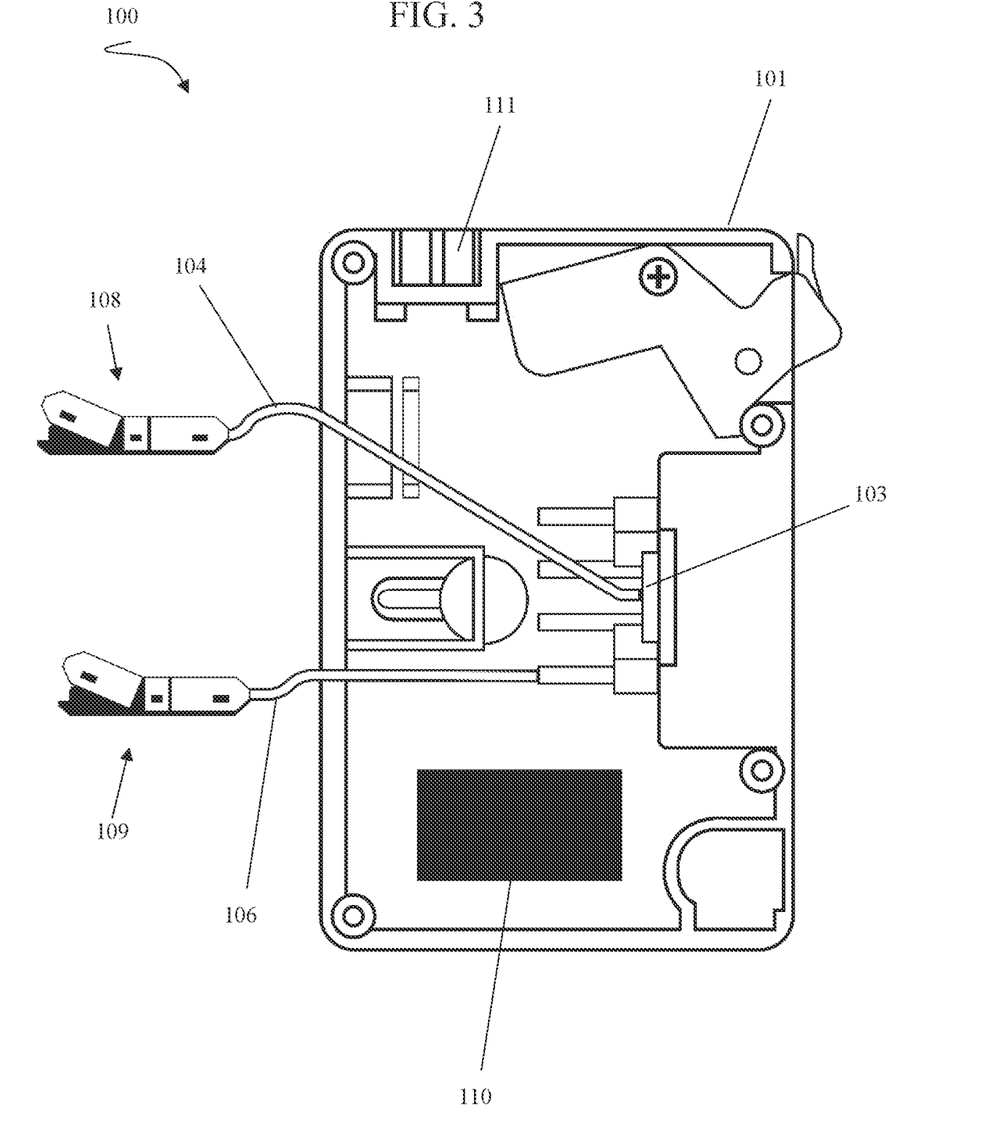
FIG. 3 illustrates the interior of the housing of the mount plate of FIG. 1.

Referring particularly to FIGS. 1-2, a first insulation piercing interconnect 108 is connected with the hot wire 104. The first insulation piercing interconnect 108 is configured to connect the hot wire 104 with the corresponding hot wire 105 of the audiovisual device 102. A second insulation piercing interconnect 109 is connected with the ground wire 106. The second insulation piercing interconnect 109 is configured to connect the ground wire 106 with the corresponding ground wire 107 of the audiovisual device 102. The first insulation piercing interconnect 108 and the second insulation piercing interconnect 109 create a solder-free connection between the hot wire 104 and the corresponding hot wire 105 of the audiovisual device 102 and between the ground wire 106 and the corresponding ground wire 107 of the audiovisual device 102, respectively, by piercing an insulative layer of wires 105 and 107 to contact the conductive metal portion of wires 105 and 107. That is, the first insulation piercing interconnect 108 and the second insulation piercing interconnect 109 do not require specialized tools or soldering to form electrical connections. As an example, the internal metal portions of wires 105 and 107 may include or may be formed of copper, silver, aluminum, or steel.

In an aspect of the present disclosure, the first insulation piercing interconnect 108 forms a semi-permanent connection between the hot wire 104 and the corresponding hot wire 105 of the audiovisual device 102 and the second insulation piercing interconnect 109 forms a semi-permanent connection between the ground wire 106 and the corresponding ground wire 107 of the audiovisual device 102. That is, after the insulation piercing interconnects 108 and 109 are secured to a wire, they are arranged to not be easily removed after the mount plate 100 is secured to the audiovisual device 102. In addition to forming a secure electrical connection, the insulation piercing interconnects 108 and 109 also serve to insulate the cut distal end portions of wires 105 and 107.

Figure 6:
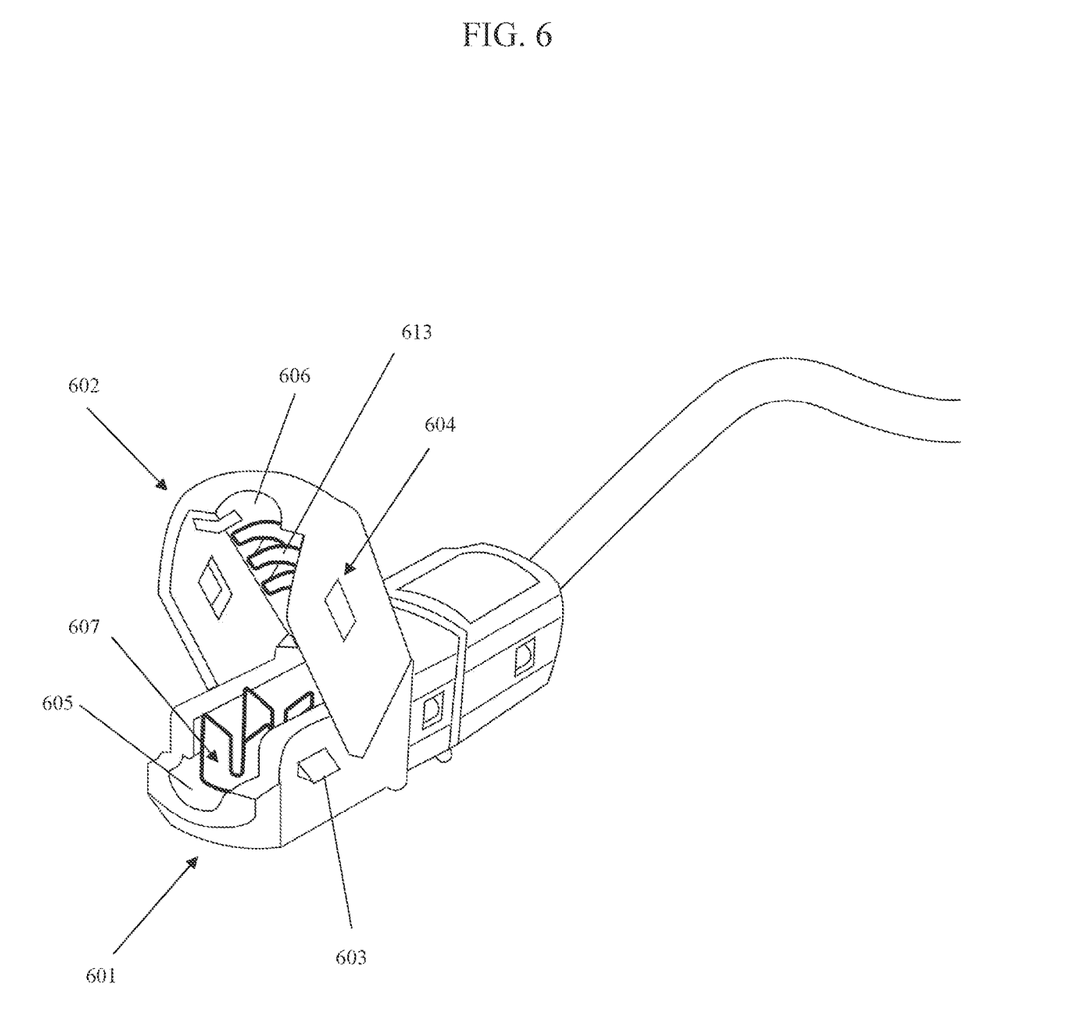
FIG. 6 is a perspective view of an exemplary insulation piercing interconnect according to aspects of the present disclosure.
Figure 7:
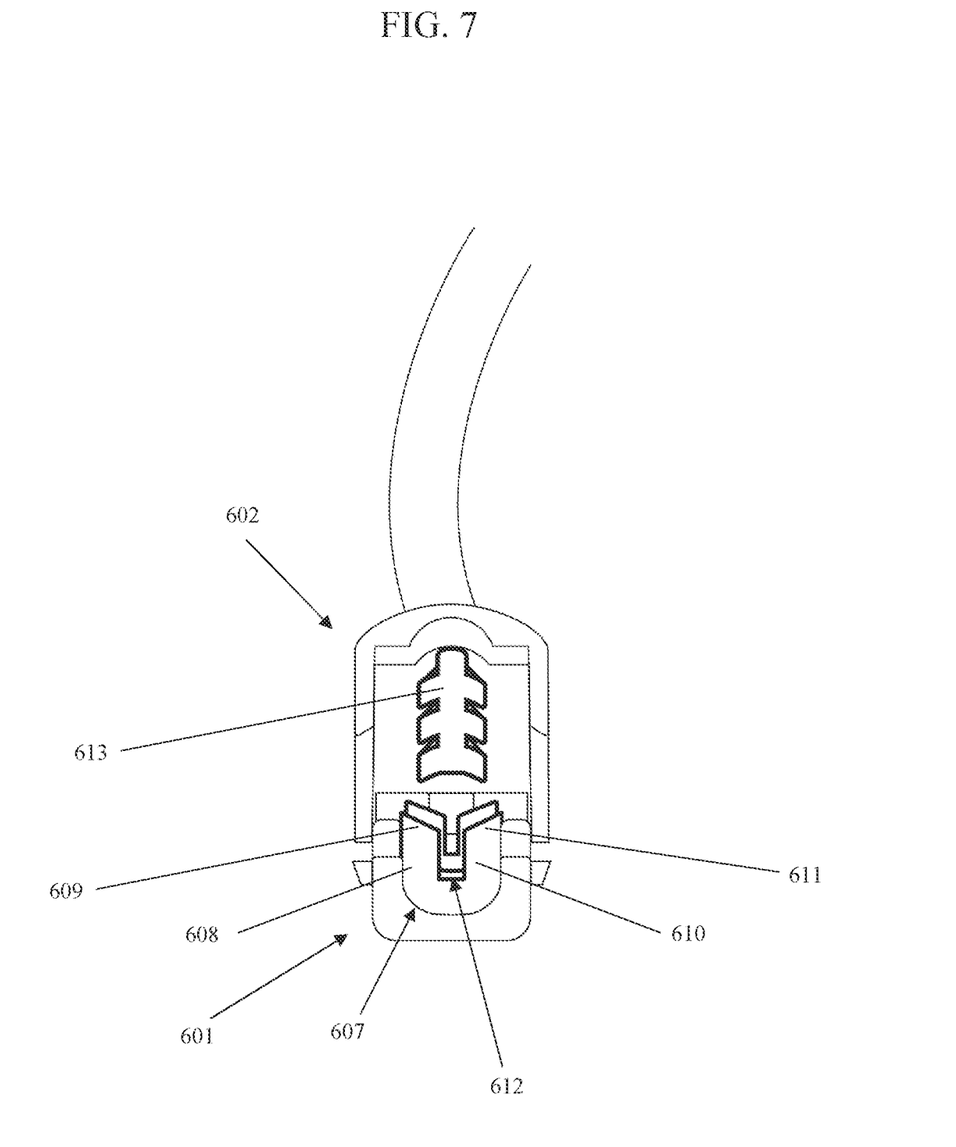
FIG. 7 is a front view of the insulation piercing interconnect of FIG. 6.

Referring particularly to FIGS. 6-7, the first insulation piercing interconnect 108 and/or the second insulation piercing interconnect 109 include(s) a first arm 601 and a second arm 602. The second arm 602 may be pivotably coupled with the first arm 601, the first arm 601 may be pivotably coupled with the second arm 602, or each of the first and second arms 601 and 602 may pivot with respect to each other (e.g., pivoting may be achieved about a connecting pin, and a biasing member, such as a spring may bias the first and/or second arms 601 and/or 602 with respect to each other).

In an aspect of the present disclosure, a protrusion 603 extends from the first arm 601 or the second arm 602. An orifice 604 is defined in the other of the first arm 601 or the second arm 602. The orifice 604 is shaped and positioned to receive the protrusion 603 extending from the first arm 601 or the second arm 602. The protrusion 603 and orifice 604 may be employed to form the semi-permanent connection between the hot wire 104 and the corresponding hot wire 105 of the audiovisual device 102 and the semi-permanent connection between the ground wire 106 and the corresponding ground wire 107 of the audiovisual device 102. That is, the protrusion 603 can be securely, but releasably, engaged within the orifice 604 by snapping the protrusion 603 into the orifice 604 or depressing the protrusion 603 to remove it from the orifice 604.

In an aspect of the present disclosure, the first arm 601 defines a first surface 605 and a second arm 602 defines a second surface 606 configured to face the first surface 605 of the first arm 601 (e.g., when the first arm 601 and the second arm 602 are in a closed configuration). A conductive member 607 extends from the first surface 605 of the first arm 601 and/or the second surface 606 of the second arm 602. The conductive member 607 is configured to pierce an insulative layer of the corresponding hot wire 105 of the audiovisual device 102 or an insulative layer of the corresponding ground wire 107 of the audiovisual device 102. The conductive member 607 may include or may be formed of copper, silver, aluminum, or steel.

Referring particularly to FIG. 7, the conductive member 607 may include a first projection 608 defining a first sharp edge 609 and a second projection 610 defining a second sharp edge 611. A channel 612 is defined between first projection 608 and the second projection 610. The projections 608 and 609 are dimensioned and positioned to pierce the insulative layer of a wire without cutting the internal metal portion of the wire. As an example, the wire may be at least partially inserted into and held in the channel 612 when the first and second arms 601 and 602 are closed to secure the first or second insulation piercing interconnects 108 or 109 to the wire.

In an aspect of the present disclosure, the first sharp edge 609 is angled toward the channel 612, and the second sharp edge 611 is angled toward the channel 612. Thus, the sharp edges 609 and 611 are at least partially contoured to a rounded shape of a wire, and also direct the wire toward the channel 612. The sharp edges 609 and 611 may form a curved profile configured to conform with a shape and size of a wire they are configured to contact.

Referring again to FIGS. 6 and 7, a cable lock 613 extends from the first arm 601 or the second arm 602. The cable lock 613 is configured to prevent longitudinal translation of the corresponding hot wire 105 of the audiovisual device 102 or the corresponding ground wire 107 of the audiovisual device 102. As an example, the cable lock 613 may include or may be formed of plastic and/or rubber. Thus, the cable lock 613 may also insulate the distal end portion of the corresponding wire, such as a distal-facing surface of a corresponding cut wire.

In an aspect of the present disclosure, the mount plate housing 101 includes a V-mount (see, e.g., mount plate 500 in FIG. 5), a B-mount or a 3-stud mount battery connection (see, e.g., mount plate 100 in FIGS. 1-4). Mount plates having different mounting arrangements for connecting with different types of batteries is described in U.S. Pat. No. 10,197,630, the entire contents of which are incorporated by reference herein.

In an aspect of the present disclosure, the mount plate 100 includes at least one auxiliary port 111.

In an aspect of the present disclosure, the mount plate 100 is configured to receive a dual-voltage battery.

Referring particularly to FIG. 4, the mount plate 100 includes a low voltage pin (see, e.g., first power terminal 614) configured to conduct low voltage current to the audiovisual device 102. The mount plate 100 also include a high voltage pin (see, e.g., second power terminal 615) configured to conduct high voltage current to the audiovisual device 102. As an example, the low voltage pin is configured to conduct a current from about 11 volts to about 17 volts to the audiovisual device 102 and the high voltage pin is configured to conduct current from about 17.1 volts to about 34 volts to the audiovisual device 102. The same ground terminal 616 may be employed when either of the high voltage pin or the low voltage pin is employed for conducting electricity between the battery and the audiovisual device 102. The use of the low voltage pin and the high voltage pin allows for a connection to a dual-voltage battery that is configured to output at least two different voltages.

In an aspect of the present disclosure, a switching circuit 110 (see, e.g., FIG. 3) selectively activates the first battery power terminal 614 or the second battery power terminal 615. The switching circuit 110 may include a resistor or a magnet. An exemplary switching circuit is described in U.S. Pat. No. 10,630,095, the entire contents of which are incorporated by reference herein.

Figure 5:
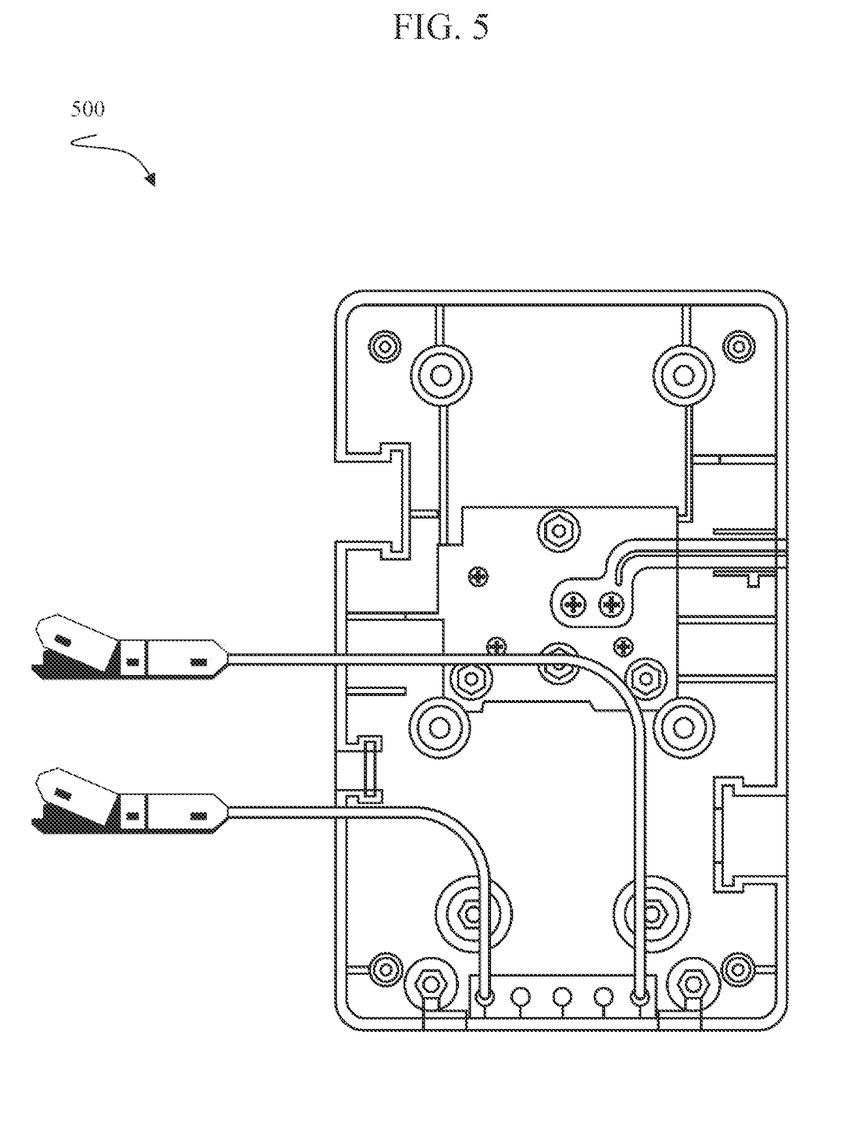
FIG. 5 illustrates the interior of another mount plate having a V-mount battery connection.

FIG. 5 illustrates the interior of mount plate 500 having a V-mount battery connection. The V-mount mount plate 500 is substantially the same as the mount plate 100 described herein, aside from the style of the battery connection.

In use and referring particularly to FIGS. 1 and 2, an old mount plate 202 is removed from the audiovisual device 102 (e.g., by unscrewing a number of screws 203 or other connecting members) to expose wiring (see, e.g., wires 105 and 107) extending between the old mount plate 202 and the audiovisual device 102. The wires (see, e.g., wires 105 and 107) can be cut and connected with interconnects 108 or 109 by inserting cut distal ends of wires 105 and 107 into interconnects 108 or 109, respectively, and snapping shut or otherwise engaging the interconnects 108 or 109 to secure the interconnects 108 or 109 to the distal end portions of wires 105 and 107. The interconnects 108 or 109 operate by piercing an insulative layer of wires 105 and 107 to create an electrical contact with the internal metal portion (e.g., a copper wire) of wires 105 and 107 to electrically connect wires 105 and 107 with wires 104 and 106, respectively.

After wires 105 and 107 are electrically connected with wires 104 and 106, respectively, by interconnects 108 and 109, respectively, the new mount plate (e.g., mount plate 100 or 500) can be attached to the audiovisual device 102, such as by utilizing the original screws 203 or other connecting members of the old mount plate 202. This is useful, for example, in upgrading an audiovisual device to a new mount plate configured to receive a higher voltage battery, or a battery including upgraded technology, such as more efficient power usage (e.g., longer operating times, quicker charging times, or multiple operational voltages).

A mount plate having upgraded capabilities can be used to replace an older mount plate. A mount plate having various features is described in U.S. Pat. No. 10,841,492, the entire contents of which are incorporated by reference herein.

Figure 8:
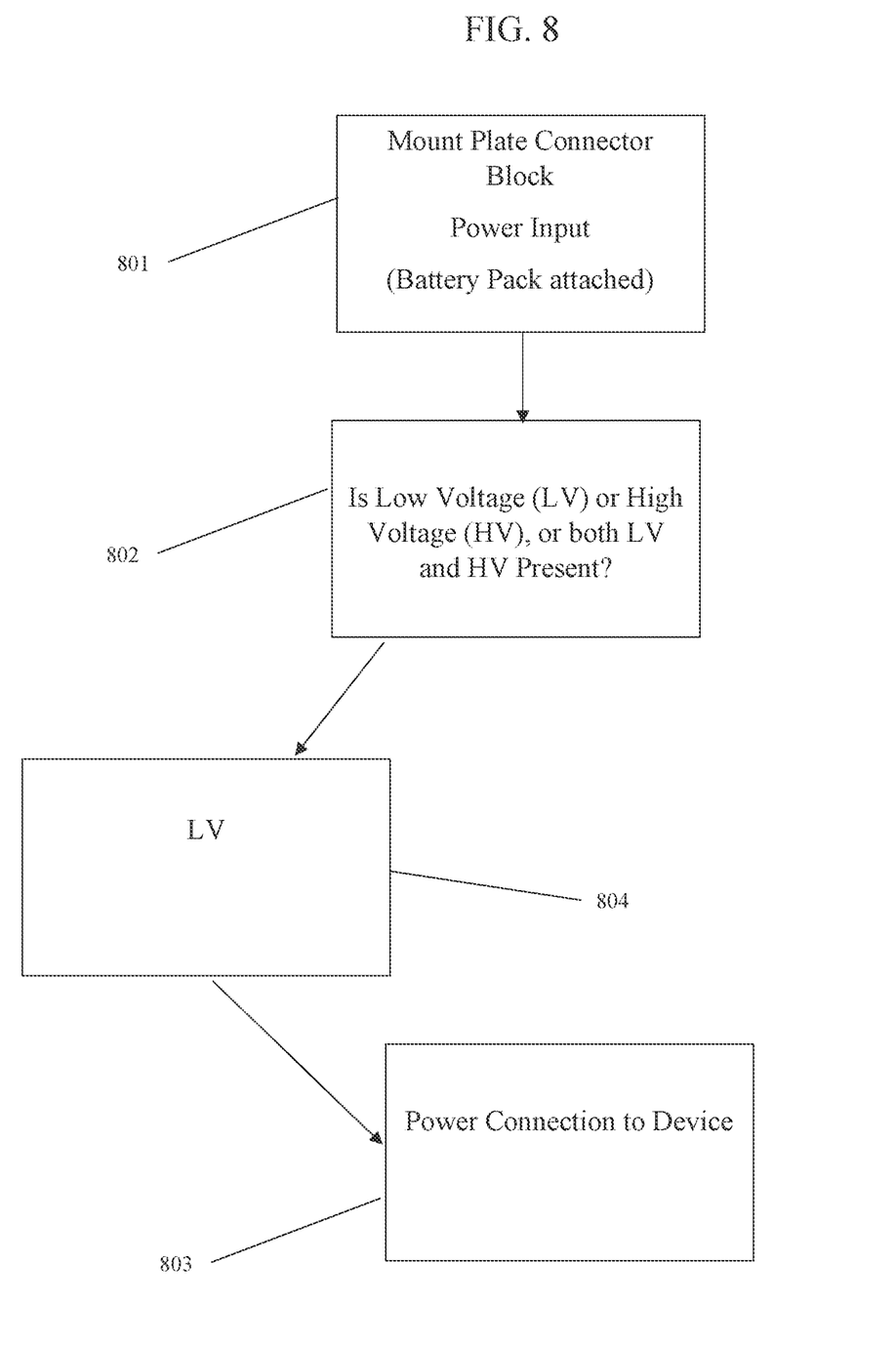
FIG. 8 is a flow chart of a method of delivering low voltage power from a battery to an audiovisual device according to aspects of the present disclosure.
Figure 9:
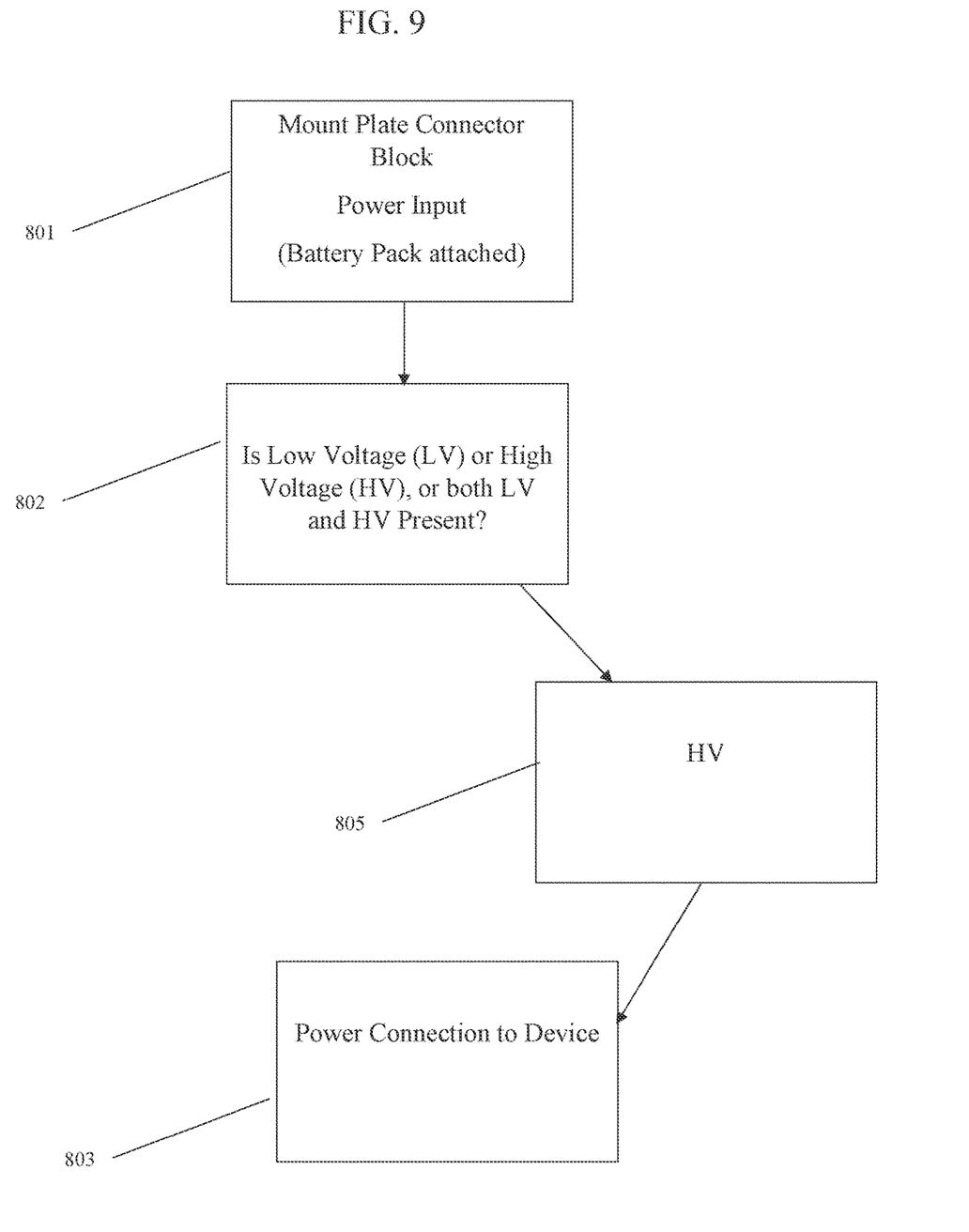
FIG. 9 is a flow chart of a method of delivering high voltage power from a battery to an audiovisual device according to aspects of the present disclosure.
Figure 10:
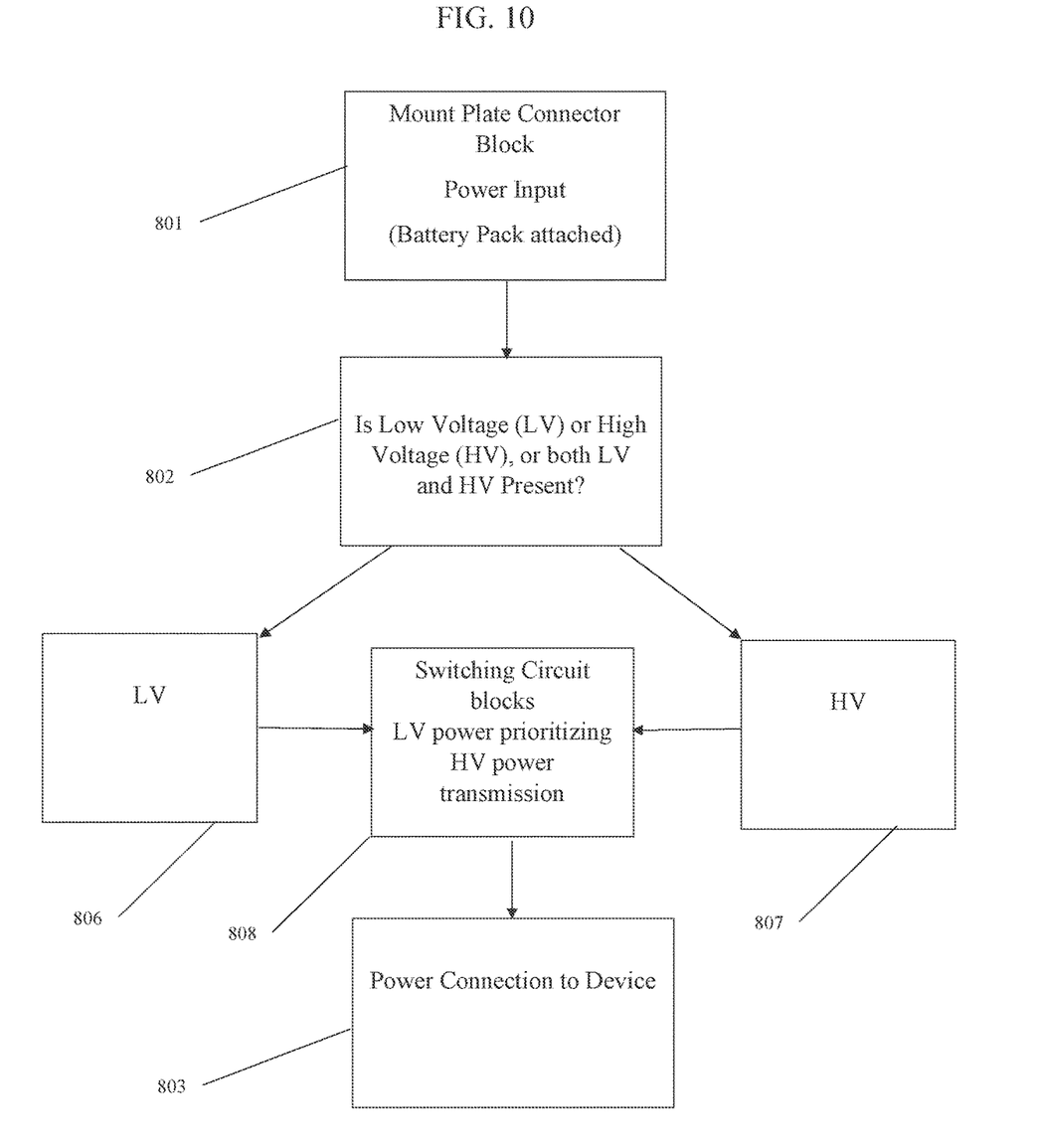
FIG. 10 is a flow chart of a method of delivering high voltage power from a battery to an audiovisual device when both low voltage power and high voltage power are available from the battery.

In use and referring generally to FIGS. 8-10, a method of utilizing a mount plate described herein includes attaching a battery pack to the mount plate (step 801), determining if low voltage (LV) power, high voltage (HV) power, or both HV and LV power is available from the battery pack (step 802) and powering on the battery connection to the audiovisual device (step 803) to provide the LV or HV power to the audiovisual device.

Referring particularly to FIG. 8, if only LV power is detected (step 804) as available from the battery, then a relatively low voltage is provided to the audiovisual device.

Referring particularly to FIG. 9, if only HV power is detected (step 805) as available from the battery, then a relatively high voltage is provided to the audiovisual device.

Referring particularly to FIG. 10, if both LV and HV power is detected (steps 806 and 807) as available from the battery, then a switching circuit blocks the LV power and provides the HV power to the audiovisual device (step 808).

It will be understood that various modifications may be made to the aspects and features disclosed herein. Therefore, the above description should not be construed as limiting, but merely as exemplifications of various aspects and features. Those skilled in the art will envision other modifications within the scope and spirit of the claims appended thereto.

What is claimed is:

1. A mount plate, comprising:
a mount plate housing configured to be coupled with at least one audiovisual device, the mount plate housing configured to connect with at least one battery;
a power terminal arranged in the mount plate housing, the power terminal configured to provide electrical power to the at least one audiovisual device;
a hot wire connected with the power terminal and extending therefrom, the hot wire configured to connect with a corresponding hot wire of the at least one audiovisual device;
a ground wire connected with the mount plate housing, the ground wire configured to connect with a corresponding ground wire of the at least one audiovisual device;
a first insulation piercing interconnect connected with the hot wire, the first insulation piercing interconnect configured to connect the hot wire with the corresponding hot wire of the at least one audiovisual device; and
a second insulation piercing interconnect connected with the ground wire, the second insulation piercing interconnect configured to connect the ground wire with the corresponding ground wire of the at least one audiovisual device.

2. The mount plate of claim 1, wherein the first insulation piercing interconnect and the second insulation piercing interconnect create a solder-free connection between at least one of the hot wire and the corresponding hot wire of the at least one audiovisual device and between the ground wire and the corresponding ground wire of the at least one audiovisual device.

3. The mount plate of claim 1, wherein the at least one audiovisual device is a light, a camera, or a monitor.

4. The mount plate of claim 1, wherein the mount plate housing includes a V-mount, a B-mount or a 3-stud mount battery connection.

5. The mount plate of claim 1, wherein the first insulation piercing interconnect forms a semi-permanent connection between the hot wire and the corresponding hot wire of the at least one audiovisual device, and wherein the second insulation piercing interconnect forms a semi-permanent connection between the ground wire and the corresponding ground wire of the at least one audiovisual device.

6. The mount plate of claim 1, wherein at least one of the first insulation piercing interconnect or the second insulation piercing interconnect includes:
a first arm;
a second arm pivotably coupled with the first arm;
a protrusion extending from the first arm or the second arm; and
an orifice defined in the other of the first arm or the second arm, wherein the protrusion is configured to receive the protrusion extending from the first arm or the second arm.

7. The mount plate of claim 1, wherein the mount plate housing connects with the at least one battery by an electromechanical connection.

8. The mount plate of claim 1, wherein the mount plate housing includes at least one auxiliary port.

9. The mount plate of claim 1, wherein the mount plate housing is configured to receive a dual-voltage battery.

10. The mount plate of claim 1, wherein at least one of the first insulation piercing interconnect or the second insulation piercing interconnect includes:
a first arm defining a first surface;
a second arm defining a second surface configured to face the first surface of the first arm, wherein the second arm is pivotably coupled with the first arm;
at least one conductive member extending from at least one of the first surface of the first arm or the second surface of the second arm, wherein the at least one conductive member is configured to pierce an insulative layer of the corresponding hot wire of the at least one audiovisual device or an insulative layer of the corresponding ground wire of the at least one audiovisual device.

11. The mount plate of claim 10, wherein the at least one conductive member includes:
a first projection defining a first sharp edge;
a second projection defining a second sharp edge; and
a channel defined between first projection and the second projection.

12. The mount plate of claim 11, wherein the first sharp edge is angled toward the channel, and wherein the second sharp edge is angled toward the channel.

13. The mount plate of claim 12, further including a cable lock extending from at least one of the first arm or the second arm, wherein the cable lock is configured to prevent longitudinal translation of the corresponding hot wire of the at least one audiovisual device or the corresponding ground wire of the at least one audiovisual device.

14. The mount plate of claim 1, wherein the mount plate housing includes a first battery power terminal, a second battery power terminal, and a battery ground terminal, wherein the first battery power terminal and the second battery power terminal are configured to conduct different voltages from the at least one battery.

15. The mount plate of claim 14, further including a switching circuit configured to selectively activate the first battery power terminal or the second battery power terminal.

16. The mount plate of claim 15, wherein the switching circuit includes a resistor or a magnet.

17. The mount plate of claim 1, further including:
   a low voltage pin configured to conduct low voltage current to the at least one audiovisual device; and
   a high voltage pin configured to conduct high voltage current to the at least one audiovisual device.

18. The mount plate of claim 17, wherein the low voltage pin is configured to conduct a current from about 11 volts to about 17 volts to the at least one audiovisual device, and wherein the high voltage pin is configured to conduct current from about 17.1 volts to about 34 volts to the at least one audiovisual device.

* * * * *